(12) United States Patent
Pavloff et al.

(10) Patent No.: US 7,981,262 B2
(45) Date of Patent: Jul. 19, 2011

(54) PROCESS KIT FOR SUBSTRATE PROCESSING CHAMBER

(75) Inventors: Cristopher Mark Pavloff, San Francisco, CA (US); Ilyoung Hong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1207 days.

(21) Appl. No.: 11/668,461

(22) Filed: Jan. 29, 2007

(65) Prior Publication Data

US 2008/0178801 A1 Jul. 31, 2008

(51) Int. Cl.
*C23C 14/34* (2006.01)
*C23C 16/00* (2006.01)

(52) U.S. Cl. .............. 204/298.11; 118/720; 118/721

(58) Field of Classification Search ............ 204/298.11; 118/720, 721
See application file for complete search history.

(56) References Cited

U.S. PATENT DOCUMENTS

| | | | |
|---|---|---|---|
| 2,705,500 | A | 4/1955 | Deer |
| 3,117,883 | A | 1/1964 | Pierett |
| 3,457,151 | A | 7/1969 | Kortejarvi |
| 3,482,082 | A | 12/1969 | Israeli |
| 3,522,083 | A | 7/1970 | Woolman |
| 3,565,771 | A | 2/1971 | Gulla |
| 3,679,460 | A | 7/1972 | Reid |
| RE31,198 | E | 4/1983 | Binns |
| 4,412,133 | A | 10/1983 | Eckes et al. |
| 4,419,201 | A | 12/1983 | Levinstein et al. |
| 4,480,284 | A | 10/1984 | Tojo et al. |
| 4,491,496 | A | 1/1985 | Laporte et al. |
| 4,606,802 | A | 8/1986 | Kobayashi et al. |
| 4,645,218 | A | 2/1987 | Ooshio et al. |
| 4,665,463 | A | 5/1987 | Ward et al. |
| 4,673,554 | A | 6/1987 | Niwa et al. |
| 4,713,119 | A | 12/1987 | Earhart et al. |
| 4,717,462 | A | 1/1988 | Homma et al. |
| 4,732,792 | A | 3/1988 | Fujiyama |

(Continued)

FOREIGN PATENT DOCUMENTS

DE 19719133 11/1998

(Continued)

OTHER PUBLICATIONS

Nakasuji, et al., "Low Voltage and High Speed Operating Electrostatic Wafer Chuck," J. Vac. Sci. Technol. A, 10(6):3573-3578 (Nov./Dec. 1992).

Rosenberg, RW, "Increasing PVD Tool Uptime and Particle Control with Twin-Wire-Arc Spray Coatings", Mar. 2001, p. 103-105, 108, 11, vol. 19, No. 3, Cannon Comm., Santa Monic, CA.

(Continued)

*Primary Examiner* — Rodney G McDonald

(74) *Attorney, Agent, or Firm* — Patterson & Sheridan, L.L.P.

(57) ABSTRACT

A process kit comprises a shield and ring assembly positioned about a substrate support in a processing chamber to reduce deposition of process deposits on internal chamber components and an overhang edge of the substrate. The shield comprises a cylindrical band having a top wall that surrounds a sputtering target and a bottom wall that surrounds the substrate support, a support ledge, a sloped step, and a U-shaped channel with gas conductance holes. The ring assembly comprises a deposition ring and cover ring, the cover ring having a bulb-shaped protuberance about the periphery of the ring.

25 Claims, 4 Drawing Sheets

U.S. PATENT DOCUMENTS

| | | |
|---|---|---|
| 4,756,322 A | 7/1988 | Lami |
| 4,832,781 A | 5/1989 | Mears |
| 4,872,250 A | 10/1989 | De Marco |
| 4,913,784 A | 4/1990 | Bogenshutz et al. |
| 4,959,105 A | 9/1990 | Neidiffer et al. |
| 4,995,958 A | 2/1991 | Anderson et al. |
| 4,996,859 A | 3/1991 | Rose et al. |
| 5,009,966 A | 4/1991 | Garg et al. |
| 5,032,469 A | 7/1991 | Merz et al. |
| 5,055,946 A | 10/1991 | Logan et al. |
| 5,064,511 A | 11/1991 | Gobbetti et al. |
| 5,104,501 A | 4/1992 | Okabayashi |
| 5,104,834 A | 4/1992 | Watanabe et al. |
| 5,117,121 A | 5/1992 | Watanabe et al. |
| 5,151,845 A | 9/1992 | Watanabe et al. |
| 5,164,016 A | 11/1992 | Henriet et al. |
| 5,166,856 A | 11/1992 | Liporace et al. |
| 5,180,322 A | 1/1993 | Yamamoto et al. |
| 5,180,563 A | 1/1993 | Lai et al. |
| 5,191,506 A | 3/1993 | Logan et al. |
| 5,202,008 A | 4/1993 | Talieh |
| 5,215,624 A | 6/1993 | Dastolfo et al. |
| 5,215,639 A | 6/1993 | Boys |
| 5,248,386 A | 9/1993 | Dastolfo et al. |
| 5,258,047 A | 11/1993 | Tokisue et al. |
| 5,270,266 A | 12/1993 | Hirano et al. |
| 5,275,683 A | 1/1994 | Arami et al. |
| 5,280,156 A | 1/1994 | Niori et al. |
| 5,292,554 A | 3/1994 | Sinha et al. |
| 5,304,248 A | 4/1994 | Cheng et al. |
| 5,314,597 A | 5/1994 | Harra |
| 5,315,473 A | 5/1994 | Collins et al. |
| 5,324,053 A | 6/1994 | Kubota et al. |
| 5,325,261 A | 6/1994 | Horwitz |
| 5,338,367 A | 8/1994 | Henriet et al. |
| 5,350,479 A | 9/1994 | Collins et al. |
| 5,356,723 A | 10/1994 | Kimoto et al. |
| 5,366,585 A | 11/1994 | Robertson et al. |
| 5,382,469 A | 1/1995 | Kubota et al. |
| 5,391,275 A | 2/1995 | Mintz |
| 5,401,319 A | 3/1995 | Banholzer et al. |
| 5,407,551 A | 4/1995 | Sieck et al. |
| 5,409,590 A | 4/1995 | Hurwitt et al. |
| 5,429,711 A | 7/1995 | Watanabe et al. |
| 5,433,835 A | 7/1995 | Demaray et al. |
| 5,458,759 A | 10/1995 | Hosokawa et al. |
| 5,460,694 A | 10/1995 | Schapira et al. |
| 5,463,526 A | 10/1995 | Mundt |
| 5,474,649 A | 12/1995 | Kava et al. |
| 5,487,822 A | 1/1996 | Demaray et al. |
| 5,490,913 A | 2/1996 | Schertler et al. |
| 5,509,558 A | 4/1996 | Imai et al. |
| 5,512,078 A | 4/1996 | Griffin |
| 5,518,593 A | 5/1996 | Hoskawa et al. |
| 5,520,740 A | 5/1996 | Kanai et al. |
| 5,531,835 A | 7/1996 | Fodor et al. |
| 5,542,559 A | 8/1996 | Kawakami et al. |
| 5,549,802 A | 8/1996 | Guo |
| 5,587,039 A | 12/1996 | Salimian et al. |
| 5,605,637 A | 2/1997 | Shan et al. |
| 5,614,055 A | 3/1997 | Fairbairn et al. |
| 5,614,071 A | 3/1997 | Mahvan et al. |
| 5,643,422 A | 7/1997 | Yamada |
| 5,658,442 A | 8/1997 | Van Gogh et al. |
| 5,660,640 A | 8/1997 | Laube |
| 5,671,835 A | 9/1997 | Tanaka et al. |
| 5,684,669 A | 11/1997 | Collins et al. |
| 5,685,914 A | 11/1997 | Hills et al. |
| 5,685,959 A | 11/1997 | Bourez et al. |
| 5,690,795 A * | 11/1997 | Rosenstein et al. ........ 204/192.1 |
| 5,695,825 A | 12/1997 | Scruggs |
| 5,700,179 A | 12/1997 | Hasegawa et al. |
| 5,714,010 A | 2/1998 | Matsuyama et al. |
| 5,720,818 A | 2/1998 | Donde et al. |
| 5,736,021 A | 4/1998 | Ding et al. |
| 5,745,331 A | 4/1998 | Shamoulian et al. |
| 5,748,434 A | 5/1998 | Rossman et al. |
| 5,755,887 A | 5/1998 | Sano et al. |
| 5,762,748 A | 6/1998 | Banholzer et al. |
| 5,763,851 A | 6/1998 | Forster et al. |
| 5,792,562 A | 8/1998 | Collins et al. |
| 5,800,686 A | 9/1998 | Littau et al. |
| 5,803,977 A | 9/1998 | Tepman et al. |
| 5,808,270 A | 9/1998 | Marantz et al. |
| 5,810,931 A | 9/1998 | Stevens et al. |
| 5,812,362 A | 9/1998 | Ravi |
| 5,821,166 A | 10/1998 | Hajime et al. |
| 5,824,197 A | 10/1998 | Tanaka |
| 5,830,327 A | 11/1998 | Kolnekow |
| 5,840,434 A | 11/1998 | Kojima et al. |
| 5,855,687 A | 1/1999 | DuBois et al. |
| 5,858,100 A | 1/1999 | Maeda et al. |
| 5,868,847 A | 2/1999 | Chen et al. |
| 5,876,573 A | 3/1999 | Moslehi et al. |
| 5,879,523 A | 3/1999 | Wang et al. |
| 5,879,524 A | 3/1999 | Hurwitt et al. |
| 5,885,428 A | 3/1999 | Kogan |
| 5,886,863 A | 3/1999 | Nagasaki et al. |
| 5,893,643 A | 4/1999 | Kumar et al. |
| 5,901,751 A | 5/1999 | Huo |
| 5,903,428 A | 5/1999 | Grimard et al. |
| 5,910,338 A | 6/1999 | Donde et al. |
| 5,916,378 A | 6/1999 | Bailey et al. |
| 5,916,454 A | 6/1999 | Richardson et al. |
| 5,920,764 A | 7/1999 | Hanson |
| 5,922,133 A | 7/1999 | Tepman et al. |
| 5,930,661 A | 7/1999 | Lu |
| 5,939,146 A | 8/1999 | Lavernia |
| 5,942,041 A | 8/1999 | Lo et al. |
| 5,942,445 A | 8/1999 | Lo et al. |
| 5,948,288 A | 9/1999 | Treves et al. |
| 5,951,374 A | 9/1999 | Kato et al. |
| 5,951,775 A | 9/1999 | Tepman |
| 5,953,827 A | 9/1999 | Or et al. |
| 5,963,778 A | 10/1999 | Stellrecht |
| 5,967,047 A | 10/1999 | Kuhn et al. |
| 5,976,327 A | 11/1999 | Tanaka |
| 5,985,033 A | 11/1999 | Yudovsky et al. |
| 6,000,415 A | 12/1999 | Huo et al. |
| 6,010,583 A | 1/2000 | Annavarapu et al. |
| 6,014,979 A | 1/2000 | Van Autryve et al. |
| 6,015,465 A | 1/2000 | Kholodenko et al. |
| 6,026,666 A | 2/2000 | Zimmermann et al. |
| 6,027,604 A | 2/2000 | Lim et al. |
| 6,036,587 A | 3/2000 | Tolles et al. |
| 6,051,114 A | 4/2000 | Yao et al. |
| 6,051,122 A | 4/2000 | Flanigan |
| 6,059,945 A | 5/2000 | Fu et al. |
| 6,071,389 A | 6/2000 | Zhang |
| 6,073,830 A | 6/2000 | Hunt et al. |
| 6,086,735 A | 7/2000 | Gilman et al. |
| 6,095,084 A | 8/2000 | Shamouilian et al. |
| 6,096,135 A | 8/2000 | Guo et al. |
| 6,103,069 A | 8/2000 | Davenport |
| 6,103,070 A | 8/2000 | Hong |
| 6,106,625 A | 8/2000 | Koai et al. |
| 6,108,189 A | 8/2000 | Weldon et al. |
| 6,120,621 A | 9/2000 | Jin et al. |
| 6,120,640 A | 9/2000 | Shih et al. |
| 6,123,804 A | 9/2000 | Babassi et al. |
| 6,132,566 A | 10/2000 | Hofmann et al. |
| 6,143,086 A | 11/2000 | Tepman |
| 6,143,432 A | 11/2000 | de Rochemont et al. |
| 6,146,509 A | 11/2000 | Aragon |
| 6,149,784 A | 11/2000 | Su et al. |
| 6,150,762 A | 11/2000 | Kim et al. |
| 6,152,071 A | 11/2000 | Akiyama et al. |
| 6,156,124 A | 12/2000 | Tobin |
| 6,159,299 A | 12/2000 | Koai et al. |
| 6,162,297 A | 12/2000 | Mintz et al. |
| 6,162,336 A | 12/2000 | Lee |
| 6,168,668 B1 | 1/2001 | Yudovsky |
| 6,170,429 B1 | 1/2001 | Schoepp et al. |
| 6,176,981 B1 | 1/2001 | Hong et al. |
| 6,183,614 B1 | 2/2001 | Fu |
| 6,183,686 B1 | 2/2001 | Bardus et al. |
| 6,190,513 B1 | 2/2001 | Forster et al. |

| | | |
|---|---|---|
| 6,190,516 B1 | 2/2001 | Xiong et al. |
| 6,198,067 B1 | 3/2001 | Ikeda et al. |
| 6,199,259 B1 | 3/2001 | Demaray et al. |
| 6,210,539 B1 | 4/2001 | Tanaka et al. |
| 6,221,217 B1 | 4/2001 | Moslehi et al. |
| 6,227,435 B1 | 5/2001 | Lazarz et al. |
| 6,235,163 B1 | 5/2001 | Angalo et al. |
| 6,238,528 B1 | 5/2001 | Xu et al. |
| 6,248,667 B1 | 6/2001 | Kim et al. |
| 6,250,251 B1 | 6/2001 | Akiyama et al. |
| 6,254,737 B1 | 7/2001 | Edelstein et al. |
| 6,258,170 B1 | 7/2001 | Somekh et al. |
| 6,264,812 B1 | 7/2001 | Raaijmakers et al. |
| 6,269,670 B2 | 8/2001 | Koestermeier |
| 6,270,859 B2 | 8/2001 | Zhao et al. |
| 6,274,008 B1 | 8/2001 | Gopalraja et al. |
| 6,276,997 B1 | 8/2001 | Li |
| 6,280,584 B1 | 8/2001 | Kumar et al. |
| 6,284,093 B1 | 9/2001 | Ke et al. |
| 6,287,437 B1 | 9/2001 | Pandhumsoporn et al. |
| 6,299,740 B1 | 10/2001 | Hieronymi et al. |
| 6,306,489 B1 | 10/2001 | Hellmann et al. |
| 6,306,498 B1 | 10/2001 | Yuuki et al. |
| 6,328,808 B1 | 12/2001 | Tsai et al. |
| 6,338,781 B1 | 1/2002 | Sichmann et al. |
| 6,338,906 B1 | 1/2002 | Ritland et al. |
| 6,340,415 B1 | 1/2002 | Raaijmakers et al. |
| 6,344,114 B1 | 2/2002 | Sichmann et al. |
| 6,358,376 B1 | 3/2002 | Wang et al. |
| 6,364,957 B1 | 4/2002 | Schneider et al. |
| 6,365,010 B1 | 4/2002 | Hollars |
| 6,368,469 B1 | 4/2002 | Nulman et al. |
| 6,372,609 B1 | 4/2002 | Aga |
| 6,374,512 B1 | 4/2002 | Guo et al. |
| 6,379,575 B1 | 4/2002 | Yin et al. |
| 6,383,459 B1 | 5/2002 | Singh et al. |
| 6,387,809 B2 | 5/2002 | Toyama |
| 6,391,146 B1 | 5/2002 | Bhatnagar et al. |
| 6,394,023 B1 | 5/2002 | Crocker |
| 6,398,929 B1 | 6/2002 | Chiang et al. |
| 6,401,652 B1 | 6/2002 | Mohn et al. |
| 6,416,634 B1 | 7/2002 | Mostovoy et al. |
| 6,423,175 B1 | 7/2002 | Huang et al. |
| 6,432,203 B1 | 8/2002 | Black et al. |
| 6,436,192 B2 | 8/2002 | Chen et al. |
| 6,444,083 B1 | 9/2002 | Steger et al. |
| 6,447,853 B1 | 9/2002 | Suzuki et al. |
| 6,454,870 B1 | 9/2002 | Brooks |
| 6,484,794 B1 | 10/2002 | Park et al. |
| 6,475,336 B1 | 11/2002 | Hubacek |
| 6,500,321 B1 | 12/2002 | Ashtiani et al. |
| 6,503,331 B1 | 1/2003 | Yudovsky et al. |
| 6,506,290 B1 | 1/2003 | Ono |
| 6,506,312 B1 | 1/2003 | Bottomfield |
| 6,545,267 B1 | 4/2003 | Miura et al. |
| 6,555,471 B2 | 4/2003 | Sandhu et al. |
| 6,558,505 B2 | 5/2003 | Suzuki et al. |
| 6,565,984 B1 | 5/2003 | Wu et al. |
| 6,566,161 B1 | 5/2003 | Rosenberg et al. |
| 6,572,732 B2 | 6/2003 | Collins |
| 6,576,909 B2 | 6/2003 | Donaldson et al. |
| 6,579,431 B1 | 6/2003 | Bolcavage et al. |
| 6,589,407 B1 | 7/2003 | Subramani et al. |
| 6,599,405 B2 | 7/2003 | Hunt et al. |
| 6,605,177 B2 | 8/2003 | Mett et al. |
| 6,619,537 B1 | 9/2003 | Zhang et al. |
| 6,620,736 B2 | 9/2003 | Drewery |
| 6,623,595 B1 | 9/2003 | Han et al. |
| 6,623,596 B1 | 9/2003 | Collins et al. |
| 6,623,597 B1 | 9/2003 | Han et al. |
| 6,623,610 B1 | 9/2003 | Onishi |
| 6,627,050 B2 | 9/2003 | Miller et al. |
| 6,627,056 B2 | 9/2003 | Wang et al. |
| H2087 H | 11/2003 | Balliett et al. |
| 6,645,357 B2 | 11/2003 | Powell |
| 6,652,668 B1 | 11/2003 | Perry et al. |
| 6,652,716 B2 | 11/2003 | Kao et al. |
| 6,660,135 B2 | 12/2003 | Yu et al. |
| 6,667,577 B2 | 12/2003 | Shannon et al. |
| 6,673,199 B1 | 1/2004 | Yamartino et al. |
| 6,676,812 B2 | 1/2004 | Chung |
| 6,682,627 B2 | 1/2004 | Shamouilian et al. |
| 6,689,249 B2 | 2/2004 | Ke et al. |
| 6,689,252 B1 | 2/2004 | Shamouilian et al. |
| 6,708,870 B2 | 3/2004 | Koenigsmann et al. |
| 6,723,214 B2 | 4/2004 | Stimson et al. |
| 6,726,805 B2 | 4/2004 | Brown et al. |
| 6,730,174 B2 | 5/2004 | Liu et al. |
| 6,743,340 B2 | 6/2004 | Fu |
| 6,749,103 B1 | 6/2004 | Ivanov et al. |
| 6,776,879 B2 | 8/2004 | Yamamoto et al. |
| 6,777,045 B2 | 8/2004 | Lin et al. |
| 6,783,639 B2 | 8/2004 | Nulman et al. |
| 6,797,362 B2 | 9/2004 | Parfeniuk et al. |
| 6,797,639 B2 | 9/2004 | Carducci et al. |
| 6,812,471 B2 | 11/2004 | Popiolkowski et al. |
| 6,824,612 B2 | 11/2004 | Stevens et al. |
| 6,824,652 B2 | 11/2004 | Park |
| 6,837,968 B2 | 1/2005 | Brown et al. |
| 6,840,427 B2 | 1/2005 | Ivanov |
| 6,846,396 B2 | 1/2005 | Perrin |
| 6,858,116 B2 | 2/2005 | Okabe et al. |
| 6,872,284 B2 | 3/2005 | Ivanov et al. |
| 6,902,627 B2 | 6/2005 | Brueckner et al. |
| 6,902,628 B2 | 6/2005 | Wang et al. |
| 6,916,407 B2 | 7/2005 | Vosser et al. |
| 6,933,025 B2 | 8/2005 | Lin et al. |
| 6,933,508 B2 | 8/2005 | Popiolkowski et al. |
| 6,955,748 B2 | 10/2005 | Kim |
| 6,955,852 B2 | 10/2005 | Ivanov |
| 6,992,261 B2 | 1/2006 | Kachalov et al. |
| 7,026,009 B2 | 4/2006 | Lin et al. |
| 7,041,200 B2 | 5/2006 | Le et al. |
| 7,049,612 B2 | 5/2006 | Quach et al. |
| 7,063,773 B2 | 6/2006 | Ivanov et al. |
| 7,097,744 B2 | 8/2006 | Liu et al. |
| 7,121,938 B2 | 10/2006 | Suzuki |
| 7,131,883 B2 | 11/2006 | Park et al. |
| 7,141,138 B2 | 11/2006 | Gondhalekar et al. |
| 7,146,703 B2 | 12/2006 | Ivanov |
| 7,223,323 B2 | 5/2007 | Yang et al. |
| 7,264,679 B2 | 9/2007 | Schweitzer et al. |
| 7,294,224 B2 | 11/2007 | Vesci et al. |
| 7,294,245 B2 | 11/2007 | Fu |
| 7,407,565 B2 | 8/2008 | Wang et al. |
| 7,504,008 B2 | 3/2009 | Doan et al. |
| 7,579,067 B2 | 8/2009 | Lin et al. |
| 7,604,708 B2 | 10/2009 | Wood et al. |
| 7,618,769 B2 | 11/2009 | Brueckner et al. |
| 2001/0001367 A1 | 5/2001 | Koestermeier |
| 2001/0033706 A1 | 10/2001 | Shimomura et al. |
| 2001/0045353 A1 | 11/2001 | Hieronymi et al. |
| 2002/0029745 A1 | 3/2002 | Nagaiwa et al. |
| 2002/0033330 A1 | 3/2002 | Demaray et al. |
| 2002/0066531 A1 | 6/2002 | Ke et al. |
| 2002/0076490 A1 | 6/2002 | Chiang et al. |
| 2002/0086118 A1 | 7/2002 | Chang et al. |
| 2002/0090464 A1 | 7/2002 | Jiang et al. |
| 2002/0092618 A1 | 7/2002 | Collins |
| 2002/0100680 A1 | 8/2002 | Yamamoto et al. |
| 2003/0000647 A1 | 1/2003 | Yudovsky |
| 2003/0006008 A1 | 1/2003 | Horioka et al. |
| 2003/0019746 A1 | 1/2003 | Ford et al. |
| 2003/0026917 A1 | 2/2003 | Lin et al. |
| 2003/0029568 A1 | 2/2003 | Brown et al. |
| 2003/0037883 A1 | 2/2003 | Mett et al. |
| 2003/0047464 A1 | 3/2003 | Sun et al. |
| 2003/0085121 A1 | 5/2003 | Powell |
| 2003/0108680 A1 | 6/2003 | Gell et al. |
| 2003/0116276 A1 | 6/2003 | Weldon et al. |
| 2003/0118731 A1 | 6/2003 | He et al. |
| 2003/0127319 A1 | 7/2003 | Demaray et al. |
| 2003/0136428 A1 | 7/2003 | Krogh |
| 2003/0168168 A1 | 9/2003 | Liu et al. |
| 2003/0170486 A1 | 9/2003 | Austin et al. |
| 2003/0173526 A1 | 9/2003 | Popiolkowski et al. |
| 2003/0185935 A1 | 10/2003 | Lin et al. |
| 2003/0185965 A1 | 10/2003 | Lin et al. |

| | | | | | |
|---|---|---|---|---|---|
| 2003/0188685 A1 | 10/2003 | Wang et al. | EP | 0845545 | 6/1998 |
| 2003/0196890 A1 | 10/2003 | Le et al. | EP | 1049133 A2 | 11/2000 |
| 2003/0217693 A1 | 11/2003 | Rattner et al. | EP | 1094496 A | 4/2001 |
| 2003/0218054 A1 | 11/2003 | Koenigsmann et al. | EP | 1158072 A2 | 11/2001 |
| 2003/0221702 A1 | 12/2003 | Peebles | EP | 1258908 A2 | 11/2002 |
| 2004/0016637 A1 | 1/2004 | Yang et al. | FR | 2562097 | 10/1985 |
| 2004/0026233 A1 | 2/2004 | Perrin | GB | 1424365 A | 2/1976 |
| 2004/0031677 A1 | 2/2004 | Wang et al. | JP | 54-162969 | 12/1979 |
| 2004/0045574 A1 | 3/2004 | Tan | JP | 54162696 | 12/1979 |
| 2004/0056070 A1 | 3/2004 | Ivanov | JP | 11-59368 | 12/1987 |
| 2004/0056211 A1 | 3/2004 | Popiolkowski et al. | JP | 63235435 | 9/1988 |
| 2004/0079634 A1 | 4/2004 | Wickersham et al. | JP | 02-027748 | 1/1990 |
| 2004/0083977 A1 | 5/2004 | Brown et al. | JP | 02-101157 | 4/1990 |
| 2004/0099285 A1 | 5/2004 | Wang et al. | JP | 03-138354 | 6/1991 |
| 2004/0113364 A1 | 6/2004 | Ivanov | JP | 06-232243 | 8/1994 |
| 2004/0118521 A1 | 6/2004 | Pancham et al. | JP | 07-197272 | 8/1995 |
| 2004/0126952 A1 | 7/2004 | Gondhalekar et al. | JP | 09-017850 | 1/1997 |
| 2004/0163669 A1 | 8/2004 | Brueckner et al. | JP | 09-272965 | 10/1997 |
| 2004/0180158 A1 | 9/2004 | Lin et al. | JP | 10-045461 | 2/1998 |
| 2004/0222088 A1 | 11/2004 | Subramani et al. | JP | 63149396 | 6/1998 |
| 2004/0231798 A1 | 11/2004 | Gondhalekar et al. | JP | 10-251871 | 9/1998 |
| 2004/0251130 A1 | 12/2004 | Liu et al. | JP | 10-330971 | 12/1998 |
| 2004/0256226 A1 | 12/2004 | Wickersham | JP | 11-137440 | 5/1999 |
| 2004/0261946 A1 | 12/2004 | Endoh et al. | JP | 11-220164 | 8/1999 |
| 2005/0011749 A1 | 1/2005 | Kachalov et al. | JP | 11-283972 | 10/1999 |
| 2005/0028838 A1 | 2/2005 | Brueckner | JP | 2000-228398 | 10/1999 |
| 2005/0048876 A1 | 3/2005 | West et al. | JP | 2250990 | 10/1999 |
| 2005/0061857 A1 | 3/2005 | Hunt et al. | JP | 11-345780 | 12/1999 |
| 2005/0067469 A1 | 3/2005 | Facey et al. | JP | 2000-072529 | 3/2000 |
| 2005/0089699 A1 | 4/2005 | Lin et al. | JP | 2000-191370 | 7/2000 |
| 2005/0092604 A1 | 5/2005 | Ivanov | JP | 2002-69695 | 3/2002 |
| 2005/0098427 A1 | 5/2005 | Cho et al. | TW | 546680 | 8/2003 |
| 2005/0147150 A1 | 7/2005 | Wickersham et al. | WO | WO-9523428 | 8/1995 |
| 2005/0161322 A1 | 7/2005 | Smathers | WO | WO-9708734 | 3/1997 |
| 2005/0172984 A1 | 8/2005 | Schweitzer et al. | WO | WO-9742648 | 11/1997 |
| 2005/0178653 A1 | 8/2005 | Fisher | WO | WO-98/50599 | 11/1998 |
| 2005/0211548 A1 | 9/2005 | Gung et al. | WO | WO-9852208 | 11/1998 |
| 2005/0238807 A1 | 10/2005 | Lin | WO | WO-9903131 | 1/1999 |
| 2005/0271984 A1 | 12/2005 | Brueckner et al. | WO | WO-9913126 | 3/1999 |
| 2005/0282358 A1 | 12/2005 | Di Cioccio et al. | WO | WO-9913545 | 3/1999 |
| 2005/0284372 A1 | 12/2005 | Murugesh et al. | WO | WO-9914788 | 3/1999 |
| 2006/0005767 A1 | 1/2006 | Tsai et al. | WO | WO-99/17336 | 4/1999 |
| 2006/0070876 A1 | 4/2006 | Wu et al. | WO | WO-9928945 | 6/1999 |
| 2006/0090706 A1 | 5/2006 | Miller et al. | WO | WO-9941426 | 8/1999 |
| 2006/0105182 A1 | 5/2006 | Brueckner et al. | WO | WO-0005751 | 2/2000 |
| 2006/0108217 A1 | 5/2006 | Krempel-Hesse et al. | WO | WO-0026939 | 5/2000 |
| 2006/0188742 A1 | 8/2006 | West et al. | WO | WO-0184590 | 11/2001 |
| 2006/0251822 A1 | 11/2006 | Gell et al. | WO | WO-0184624 A2 | 11/2001 |
| 2006/0283703 A1 | 12/2006 | Lee et al. | WO | WO-02/15255 | 2/2002 |
| 2007/0059460 A1 | 3/2007 | Abney et al. | WO | WO-0223587 | 3/2002 |
| 2007/0062452 A1 | 3/2007 | Pancham et al. | WO | WO 02/093624 | 11/2002 |
| 2007/0102286 A1 | 5/2007 | Scheible et al. | WO | WO-03015137 | 2/2003 |
| 2007/0113783 A1 | 5/2007 | Lee et al. | WO | WO-03057943 | 7/2003 |
| 2007/0125646 A1 | 6/2007 | Young et al. | WO | WO-03076683 | 9/2003 |
| 2007/0170052 A1 | 7/2007 | Ritchie et al. | WO | WO-03083160 | 10/2003 |
| 2007/0173059 A1 | 7/2007 | Young et al. | WO | WO-03087427 | 10/2003 |
| 2007/0215463 A1 | 9/2007 | Parkhe et al. | WO | WO-03090248 | 10/2003 |
| 2007/0274876 A1 | 11/2007 | Chiu et al. | WO | WO-2004/010494 A2 | 1/2004 |
| 2007/0283884 A1 | 12/2007 | Tiller et al. | WO | WO-2004012242 | 2/2004 |
| 2008/0038481 A1 | 2/2008 | West et al. | WO | WO-2004015736 | 2/2004 |
| 2008/0066785 A1 | 3/2008 | Vesci et al. | WO | WO-2004074932 | 9/2004 |
| 2008/0110760 A1 | 5/2008 | Han et al. | WO | WO-2004094702 | 11/2004 |
| 2008/0141942 A1 | 6/2008 | Brown et al. | WO | WO-2005021173 | 3/2005 |
| 2008/0178801 A1 | 7/2008 | Pavloff et al. | WO | WO 2005/071137 | 8/2005 |
| 2008/0257263 A1 | 10/2008 | Pavloff et al. | WO | WO-2006053231 | 5/2006 |
| 2008/0295872 A1 | 12/2008 | Riker et al. | WO | WO-2006073585 | 7/2006 |
| 2009/0084317 A1 | 4/2009 | Wu et al. | WO | WO-2007-030824 | 3/2007 |
| 2009/0120462 A1 | 5/2009 | West et al. | WO | WO 2008/079722 | 7/2008 |
| 2009/0121604 A1 | 5/2009 | Stahr et al. | WO | WO-2008079722 | 7/2008 |
| FOREIGN PATENT DOCUMENTS | | | WO | WO-2008-133876 | 11/2008 |
| EP | 0239349 | 9/1987 | WO | WO-2008-153785 | 12/2008 |
| EP | 0439000 | 7/1991 | | | |
| EP | 0601788 | 6/1994 | | | |
| EP | 0635869 | 1/1995 | | | |
| EP | 0791956 | 8/1997 | | | |
| EP | 0818803 A | 1/1998 | | | |
| EP | 0838838 | 4/1998 | | | |
| EP | 0838838 A2 | 4/1998 | | | |

OTHER PUBLICATIONS

Tucker, Jr., Robert C., "Plasma and Detonation Gun Deposition Techniques and Coating Properties," Union Carbide Corp., Coatings Service Dept., Indianapolis, IN, pp. 454-489.

Watanabe, et al., "Effect of Additives on the Electrostatic Force of Alumina Electrostatic Chucks," J. of the Ceramic Soc. of Jpn., 100(1):1-6 (1992).

Watanabe, et al., "Electrostatic Force and Absorption Current of Alumina Electrostatic Chucks," Jpn. J. Appl. Phy., 31(Pt1, No. 7):2145-2150 (1992).

Watanabe, et al., "Relationship Between Electrical Resistivity and Electrostatic Force of Alumina Electrostatic Chuck," Jpn. J. Appl. Phy., 32(Pt1, No. 2):864-871 (1993).

Watanabe, et al., "Resistivity and Microstructure of Alumina Ceramics Added with $TiO_2$ Fired in Reducing Atmosphere," J. of the Ceramic Doc. Of Jpn. Int. Ed., 101-1076-1083.

Wright et al., "Low Temperature Etch Chuck: Modeling and Experimental Results of Heat Transfer and Wafer Temperature," J. Vac. Sci. Technol. A, 10(4):1065-1070(Jul./Aug. 1992).

* cited by examiner

PROCESS KIT FOR SUBSTRATE PROCESSING CHAMBER

BACKGROUND

Embodiments of the present invention relate to a process kit for a substrate processing chamber.

In the manufacture of integrated circuits and displays, a substrate such as a semiconductor wafer or display panel, is placed in a substrate processing chamber and processing conditions are set in the chamber to deposit or etch material on the substrate. A typical process chamber comprises chamber components that include an enclosure wall that encloses a process zone, a gas supply to provide a process gas in the chamber, a gas energizer to energize the process gas to process the substrate, a gas exhaust to remove spent gas and maintain a gas pressure in the chamber, and a substrate support to hold the substrate. Such chambers can include, for example, sputtering (PVD), chemical vapor deposition (CVD), and etching chambers. In PVD chambers, a target is sputtered by energized gas to sputter target material which then deposits on the substrate facing the target.

In sputtering processes, the material sputtered from the target also deposits on the edges of chamber components surrounding the target which is undesirable. The peripheral target regions have a dark-space region in which sputtered material redeposit as a result of ion scattering in this area. Accumulation and build-up of the sputtered material in this region is undesirable as such accumulated deposits require disassembly and cleaning or replacement of the target and surrounding components, can result in plasma shorting, and can cause arcing between the target and the chamber wall. These deposits also often debond and flake off due to thermal stresses to fall inside and contaminate the chamber and its components.

A process kit comprising a shield, cover ring and deposition ring arranged about the substrate support and chamber sidewalls, is often used to receive excess the sputtered material to protect and prevent deposition on the chamber walls and other component surfaces. Periodically, the process kit components are dismantled and removed from the chamber for cleaning off accumulated deposits. Thus it is desirable to have process kit components which are designed to receive and tolerate ever larger amounts of accumulated deposits without sticking to each other or to the substrate, or resulting in flaking off of the deposits between process clean cycles. It is further desirable to have a process kit comprising fewer parts or components, as well as having components that are shaped and arranged in relationship to one another to reduce the amounts of sputtered deposits formed on the internal surfaces of the process chamber.

Another problem arises when the chamber liners and shields heat up to excessively high temperatures due to exposure to the sputtering plasma in the chamber and poor thermal conductivity between the shield and chamber components. For example, it is difficult to control the temperature of shields made of low thermal conductivity material. The thermal resistances at contact interfaces with supporting components, such as adapters, also affect shield temperatures. Low clamping forces between the shield and adapter can also give rise to heating up of the shield. Without thermal control, the temperature of the shields cycles between idle room-temperature conditions and high temperatures during sequential substrate processing. When process deposits of high-stress metal are deposited onto the shields and subjected to large temperature swings, the adhesion of the film to the shield as well as the cohesion of the film to itself, can decrease dramatically due to, for example, a mismatch of the coefficients of thermal expansion between the film and the underlying shield. it is desirable to reduce the temperatures of shields and liners during substrate processing to reduce flaking of accumulated deposits from the shield surfaces.

Another problem with conventional substrate processing chamber and PVD processes arises due to poor gas conductance from the chamber, A high-conductance gas flow pathway is needed to both supply the necessary process gasses to the process cavity and to properly exhaust spent process gas. However, the shields and other chamber components of the process kit that line the chamber walls can substantially reduce gas conductance flows. Placing apertures in these components while increasing gas conductance therethrough, also allow line-of-sight sputtering deposits to exit the process zone through the gas conductance holes to deposit on the chamber walls. Such holes can also cause plasma leakage from within the processing cavity to surrounding chamber regions. Also, chamber components that incorporate such holes have other shortcomings including, but not limited to, requirement of additional parts, their relative flimsiness, tolerance stack-ups of multiple parts, and poor thermal conductivity at interfaces.

Thus it is desirable to have process kit components that increase thermal conductivity while reducing the flaking of process deposits from component surfaces. It is further desirable to control the temperature of the shields and liners so that they do not cycle between excessively high and low temperatures during plasma processing. It is also desirable to increase overall gas conductance while preventing line-of-sight deposition outside the process zone and reduce plasma leakage.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
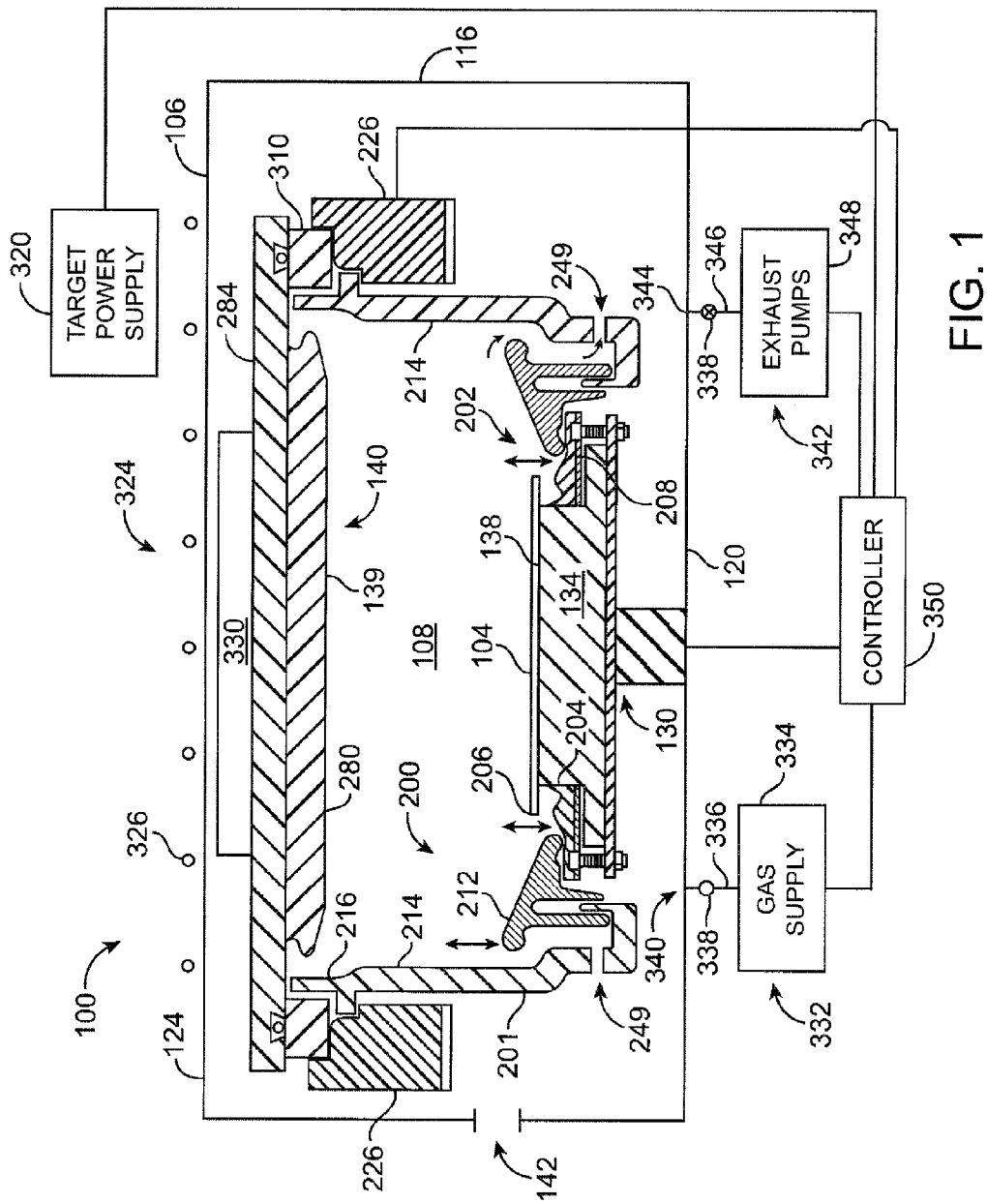
FIG. 1 is a schematic sectional side view of an embodiment of a substrate processing chamber showing process kit components and a sputtering target.

An example of a suitable process chamber 100 capable of processing a substrate 104 is shown in FIG. 1. The chamber 100 is representative of a CLEAN W™ chamber commercially available from Applied Materials Inc., Santa Clara, Calif. However, other process chambers may also be used in conjunction with the present invention. The chamber 100 comprises enclosure walls 106 that enclose a process zone 108. The walls 106 include sidewalls 116, a bottom wall 120, and a ceiling 124. The chamber 100 can be a part of a multi-chamber platform (not shown) having a cluster of interconnected chambers connected by a substrate transfer mechanism, such as a robot arm, that transfers substrates 104 between the various chambers. In the version shown in FIG. 1, the process chamber 100 is a sputter deposition chamber, also known as a physical vapor deposition or PVD chamber, capable of sputter depositing material such as one or more of aluminum, copper, tantalum, tantalum nitride, titanium, titanium nitride, tungsten and tungsten nitride, onto a substrate 104.

The chamber 100 comprises a substrate support 130 which comprises a pedestal 134 to support the substrate 104. The pedestal 134 has a substrate receiving surface 138 having a plane substantially parallel to a sputtering surface 139 of an overhead sputtering target 140. The substrate receiving surface 138 of the pedestal 134 receives and supports the substrate 104 during processing. The pedestal 134 may include an electrostatic chuck or a heater such as an electrical resistance heater or heat exchanger. In operation, a substrate 104 is introduced into the chamber 100 through a substrate loading inlet 142 in the sidewall 116 of the chamber 100 and placed onto the substrate support 130. The support 130 can be lifted or lowered by support lift bellows and a lift finger assembly can be used to lift and lower the substrate 104 onto the support 130 during placement of the substrate 104 on the substrate support 130 by a robot arm. The pedestal 134 can be maintained at an electrically floating potential or grounded during plasma operation.

Figure 2A:
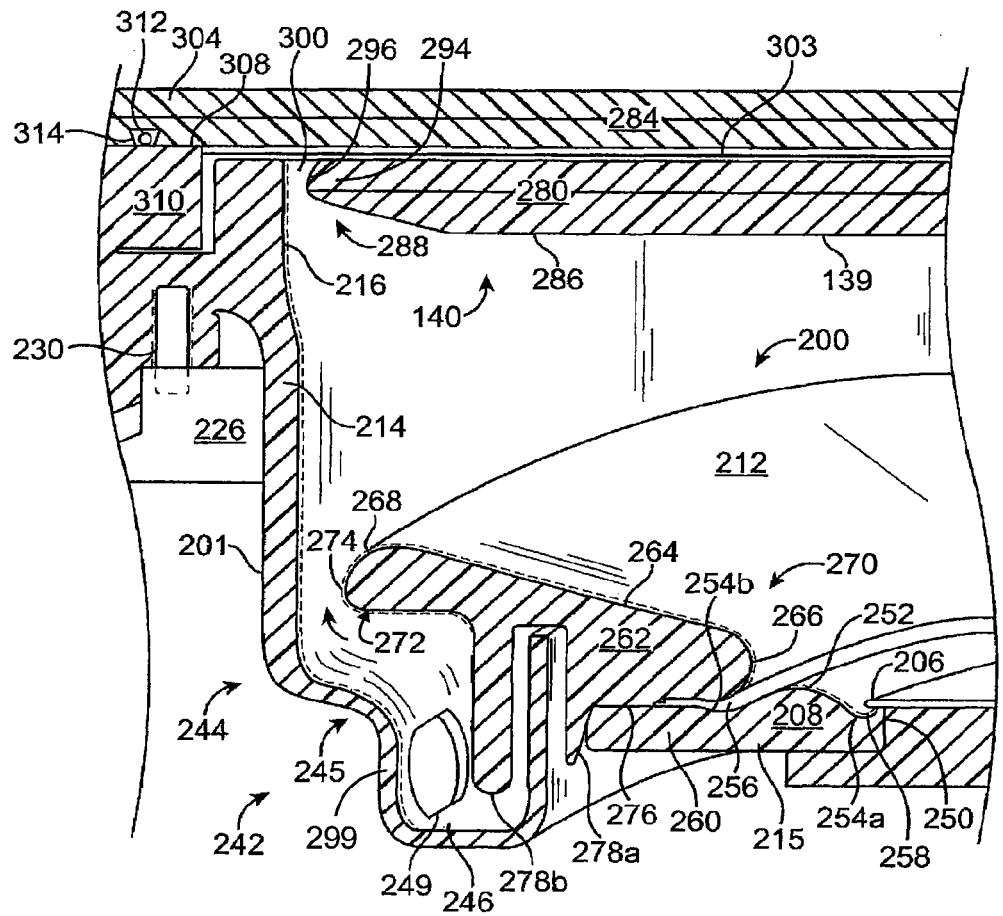
FIG. 2A is a perspective view of the process kit having a shield and ring assembly within a substrate processing chamber.
Figure 2B:
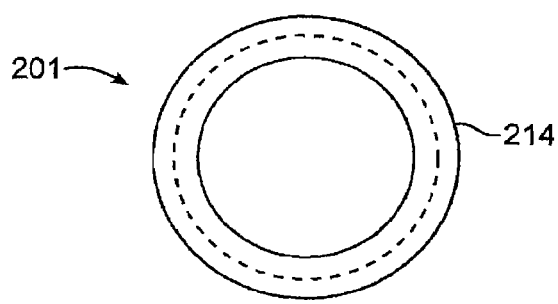
FIG. 2B is a simplified top view of the shield.

The chamber 100 also contains a process kit 200, as shown in FIGS. 2A and 2B, which comprise various components that can be easily removed from the chamber 100, for example, to clean sputtering deposits off the component surfaces, replace or repair eroded components, or to adapt the chamber 100 for other processes. In one version, the process kit 200 comprises a shield 201 and a ring assembly 202 for placement about a peripheral wall 204 of the substrate support 130, that terminates before an overhanging edge 206 of the substrate 104. The ring assembly 202 comprises a deposition ring 208 and a cover ring 212. The deposition ring 208 comprises an annular band 215 surrounding the support 130. The cover ring 212 at least partially covers the deposition ring 208. The deposition ring 208 and cover ring 212 cooperate with one another to reduce formation of sputter deposits on the peripheral walls 204 of the support 130 and the overhanging edge 206 of the substrate 104.

The shield 201 encircles the sputtering surface 139 of a sputtering target 140 that faces the substrate support 130 and the outer periphery of the substrate support 130. The shield 201 covers and shadows the sidewalls 116 of the chamber 100 to reduce deposition of sputtering deposits originating from the sputtering surface 139 of the sputtering target 140 onto the components and surfaces behind the shield 201. For example, the shield 201 can protect the surfaces of the support 130, overhanging edge 206 of the substrate 104, sidewalls 116 and bottom wall 120 of the chamber 100.

Figure 3:
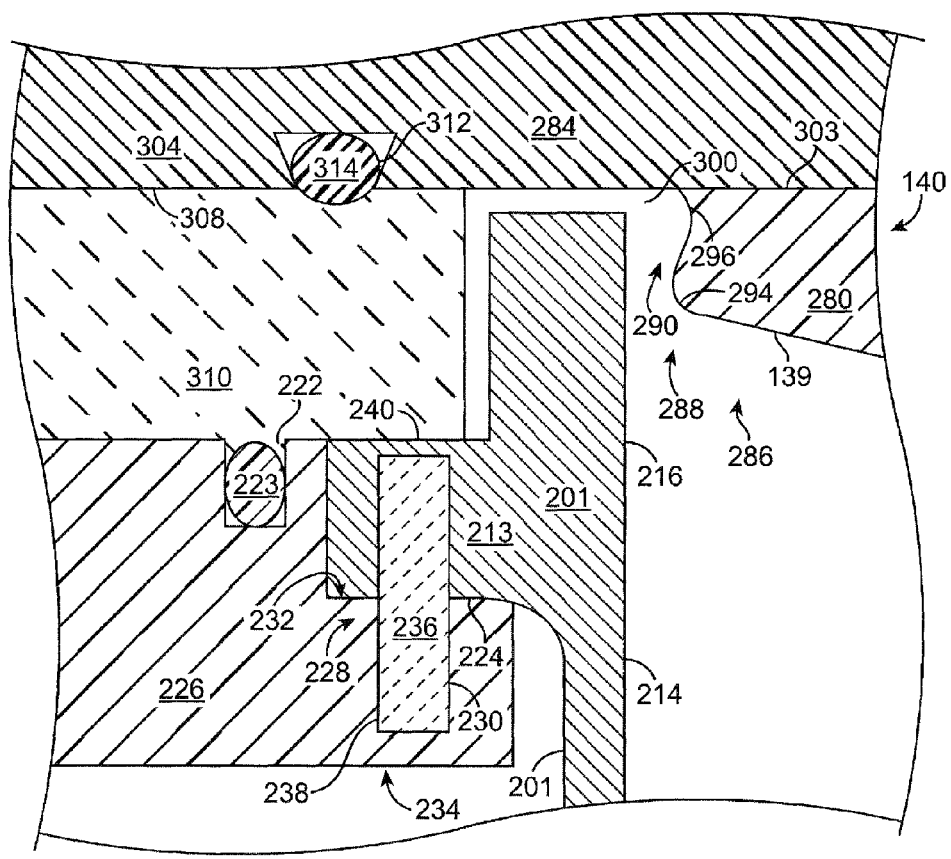
FIG. 3 is a cross-sectional view of the upper portion of the shield connected to an adapter.

As shown in FIGS. 2A, 2B and 3, the shield 201 is of unitary construction and comprises a cylindrical band 214 having a diameter sized to encircle the sputtering surface 139 of the sputtering target 140 and the substrate support 130. The cylindrical band 214 has a top wall 216 that surrounds the sputtering surface 139 of the sputtering target 140. A support ledge 219 extends radially outward from the top wall 216 of the cylindrical band 214. The support ledge 219 contains an O-ring groove 222 into which an O-ring 223 is placed to form a vacuum seal. The support ledge 219 comprises a resting surface 224 to rest upon an annular adapter 226 surrounding the sidewalls 116 of the chamber 100. The resting surface 224 of the support ledge 219 comprises a plurality of slots 228 shaped and sized to receive a pin 230 to align the shield 201 to the adapter 226.

The adapter 226 supports the shield 201 and can serve as a heat exchanger about a wall 116 of the substrate processing chamber 100. The adapter 226 and shield 201 form an assembly that allows better heat transfer from the shield 201 to and which reduces thermal expansion stresses on the material deposited on the shield. Portions of the shield 201 can become excessively heated by exposure to the plasma formed in the substrate processing chamber, resulting in thermal expansion of the shield and causing sputtering deposits formed on the shield to flake off from the shield and fall upon and contaminate the substrate 104. The adapter 226 has a contact surface 232 that contacts the resting surface 224 of the shield 201 to allow good thermal conductivity between the shield 201 and the adapter 226. In one version, the resting surface 224 of the shield 201 and the contact surface 232 of the adapter 226 each have a surface roughness of from about 10 to about 80 microinches, or even from about 16 to about 63 microinches, or in one version an average surface roughness of about 32 microinches. In one version, the adapter 226 further comprises conduits for flowing a heat transfer fluid therethrough to control the temperature of the adapter 226.

The assembly comprising the adapter 226 and shield 201 also includes an alignment pin system 234 for aligning the shield 201 to the adapter 226. The alignment pin system 232 comprises a plurality of pins 230 which are spaced apart and positioned along a circle or circular arrangement along the adapter 226. In one version, at least three pins 230 are positioned in a circle on the adapter 226. Each pin 230 comprises a rigid member 236 constructed from a material such as, for example, steel, for example, stainless steel. Each rigid member 236 has a press-fit connector 238 on one end of the member 236 that press fits into the adapter 226. Further, each rigid member 236 also comprises a head 240 on the end of the member 216 opposite to the press-fit connector 238. Each head 240 is shaped and sized to fit into one of the plurality of slots 228 on the support ledge 219 of the shield 201

Below the support ledge 219 is a bottom wall 242 that surrounds the substrate support 130. A sloped step 244 extends radially inward from the bottom wall 242 of the cylindrical band 214 and surrounds the substrate support 130. In one version, the sloped step 244 comprises a curved joint 245.

A U-shaped channel 246 is joined to the sloped step 244 of the shield. The U-shaped channel 246 has an outer first leg 299 with a plurality of gas conductance holes 249 to allow process gas to pass therethrough with improved gas conductance. The U-shaped channel 246 also has an inner second leg 253 spaced apart from the outer first leg 299 and having a larger height than the outer first leg 299. In one version, the gas holes in the outer leg 299 are substantially oval-shaped and separated by columns (not shown). In one version, each gas hole 249 has a width of from about 1 to about 2 inches and a height of from about 0.2 to about 0.8 inches.

The cylindrical band 214, support ledge 219, sloped step 244 and U-shaped channel 246 of the shield 201 comprise a unitary structure which is made from a monolith of material. For example, the entire shield 201 can be made from 300 series stainless steel, or in one version, aluminum. A unitary shield 201 is advantageous over prior shields which included multiple components, often two or three separate pieces to make up the complete shield. For example, a single piece shield is more thermally uniform than a multiple-component shield, in both heating and cooling processes. For example, the single piece shield 201 has only one thermal interface to the adapter 226, allowing for more control over the heat exchange between the shield 201 and adapter 226. A shield with multiple components makes it more difficult and laborious to remove the shield for cleaning. The single piece shield 201 has a continuous surface exposed to the sputtering deposits without interfaces or corners that are more difficult to clean out. The single piece shield 201 also more effectively shields the chamber walls 106 from sputter deposition during process cycles.

In one version, the exposed surfaces of the shield 201 are treated with CLEANCOAT™, which is commercially available from Applied Materials, Santa Clara, Calif. CLEAN-COAT™ is a twin-wire aluminum arc spray coating that is applied to substrate processing chamber components, such as the shield 201, to reduce particle shedding of deposits on the shield 201 and thus prevent contamination of a substrate 104 in the chamber 100. In one version, the twin-wire aluminum arc spray coating on the shield 201 has a surface roughness of from about 600 to about 2300 microinches.

The shield 201 has exposed surfaces facing the plasma zone 108 in the chamber 100. The exposed surfaces are bead blasted to have a surface roughness of 175±75 microinches. The texturized bead blasted surfaces serve to reduce particle shedding and prevent contamination within the chamber 100. The surface roughness average is the mean of the absolute values of the displacements from the mean line of the peaks and valleys of the roughness features along the exposed surface. The roughness average, skewness, or other properties may be determined by a profilometer that passes a needle over the exposed surface and generates a trace of the fluctuations of the height of the asperities on the surface, or by a scanning electron microscope that uses an electron beam reflected from the surface to generate an image of the surface.

The deposition ring 208 comprises an annular band 215 that extends about and surrounds the peripheral wall 204 of the support 130 as shown in FIG. 2A. The annular band 215 comprises an inner lip 250 which extends transversely from the band 215 and is substantially parallel to the peripheral wall 204 of the support 130. The inner lip 250 terminates immediately below the overhanging edge 206 of the substrate 104. The inner lip 250 defines an inner perimeter of the deposition ring 208 which surrounds the periphery of the substrate 104 and substrate support 130 to protect regions of the support 130 that are not covered by the substrate 104 during processing. For example, the inner lip 250 surrounds and at least partially covers the peripheral wall 204 of the support 130 that would otherwise be exposed to the processing environment, to reduce or even entirely preclude deposition of sputtering deposits on the peripheral wall 204. Advantageously, the deposition ring 208 can be easily removed to clean sputtering deposits from the exposed surfaces of the ring 208 so that the support 130 does not have to be dismantled to be cleaned. The deposition ring 208 can also serve to protect the exposed side surfaces of the support 130 to reduce their erosion by the energized plasma species.

In the version shown in FIG. 2A, the annular band 215 of the deposition ring 208 has a semi-circular protuberance 252 that extends along the central portion of the band 215 with radially inward dips 254a,b on either side of the semi-circular protuberance 252. The radially inward dip 254a is spaced apart from the cover ring 212 to form an arc-shaped gap 256 therebetween which acts an a labyrinth to reduce penetration of plasma species into the arc-shaped gap 256. An open inner channel 258 lies between the inner lip 250 and the semi-circular protuberance 252. The open inner channel 258 extends radially inward to terminate at least partially below the overhanging edge 206 of the substrate 104. The open inner channel 258 facilitates the removal of sputtering deposits from these portions during cleaning of the deposition ring 208. The deposition ring 208 also has a ledge 260 which extends outward and is located radially outward of the semi-circular protuberance 252. The ledge 260 serves to support the cover ring 212.

The deposition ring 208 can be made by shaping and machining a ceramic material, such as aluminum oxide. Preferably, the aluminum oxide has a purity of at least about 99.5% to reduce contamination of the chamber 100 by undesirable elements such as iron. The ceramic material is molded and sintered using conventional techniques such as isostatic pressing, followed by machining of the molded sintered preform using suitable machining methods to achieve the shape and dimensions required.

The annular band 215 of the deposition ring 208 may comprise an exposed surface that is grit blasted. Grit blasting is performed with a grit size suitable to achieve the predefined surface roughness. In one version, a surface of the deposition ring 208 is treated with a twin-wire aluminum arc-spray coating, such as, for example, CLEANCOAT™, to reduce particle shedding and contamination.

The cover ring 212 encircles and at least partially covers the deposition ring 208 to receive, and thus, shadow the deposition ring 208 from the bulk of the sputtering deposits. The cover ring 212 is fabricated from a material that can resist erosion by the sputtering plasma, for example, a metallic material such as stainless steel, titanium or aluminum, or a ceramic material, such as aluminum oxide. In one version, the cover ring 212 is composed of titanium having a purity of at least about 99.9%. In one version, a surface of the cover ring 212 is treated with a twin-wire aluminum arc-spray coating, such as, for example, CLEANCOAT™, to reduce particle shedding from the surface of the cover ring 212.

The cover ring 212 comprises an annular wedge 262 comprising an inclined top surface 264 that is sloped radially inwards and encircles the substrate support 130. The inclined top surface 264 of the annular wedge 262 has an inner and outer periphery 266,268. The inner periphery 266 comprises a projecting brim 270 which overlies the radially inward dip 254a comprising an open inner channel 258 of the deposition ring 208. The projecting brim 270 reduces deposition of sputtering deposits on the open inner channel 258 of the deposition ring 208. Advantageously, the projecting brim 270 projects a distance corresponding to at least about half the width of the arc-shaped gap 256 formed with the deposition ring 208. The projecting brim 270 is sized, shaped, and positioned to cooperate with and complement the arc-shaped gap 256 to form a convoluted and constricted flow path between the cover ring 212 and deposition ring 208 that inhibits the flow of process deposits onto the peripheral edge 204. The constricted flow path of the narrow gap 256 restricts the build-up of low-energy sputter deposits on the mating surfaces of the deposition ring 208 and cover ring 212, which would otherwise cause them to stick to one another or to the peripheral overhang edge 206 of the substrate 104. The open inner channel 258 of the deposition ring 208 which extends underneath the substrate overhang edge 206 is designed in conjunction with shadowing from the projecting brim 270 of the cover ring 212 to collect, for example, a minimum of 1540 µm of aluminum sputter deposits in an aluminum sputtering chamber, while reducing or even substantially precluding sputter deposition on the mating surfaces of the two rings 208, 212.

About the outer periphery 268 of the inclined top surface 264 is a bulb-shaped protuberance 272. In one version, the bulb-shaped protuberance 272 comprises an elliptical circumferential surface 274 that forms an arc-shaped gap with the shield 201. The inclined top surface 264, in cooperation with the bulb-shaped protuberance 272 and projecting brim 270, block line-of-sight deposition from exiting the process cavity 108 and entering the chamber body cavity. The inclined top surface 264 may be inclined at an angle of from at least about 15°. The angle of the inclined top surface 264 of the cover ring 212 is designed to, for example, minimize the buildup of sputter deposits nearest to the overhanging edge 206 of the substrate 104, which would otherwise negatively impact the deposition uniformity obtained across the substrate 104.

The cover ring 212 comprises a footing 276 extending downward from the inclined top surface 264 of the annular wedge 262, to rest upon the ledge 260 of the deposition ring 208. The footing 276 extends downwardly from the wedge 262 to press against the deposition ring 208 substantially without cracking or fracturing the ring 208.

The cover ring 212 further comprises inner and outer cylindrical bands 278a,b that extend downwardly from the annular wedge 262, with a gap therebetween. In one version, the inner and outer cylindrical bands 278a,b are substantially vertical. The cylindrical bands 278a,b are located radially outward of the footing 276 of the wedge 262. The inner cylindrical band 278a has a height that is smaller than the outer cylindrical band 278b. Typically, the height of the outer band 278b is at least about 1.2 times the height of the inner band 278a. For example, for a cover ring 212 having an inner radius of about 154 mm, the height of the outer band 278b is from about 15 to about 35 mm, or for example, 25 mm; and the height of the inner band 278a is from about 12 to about 24 mm, for example, about 19 mm.

The cover ring 212 is adjustable and effectively shields conductance holes 249 at a range of different heights. For example, the cover ring 212 is capable of being raised and lowered to adjust the height of the cover ring 212 in relationship to the substrate support 130 in the chamber.

The space or gap between the shield 201 and cover ring 212 forms a convoluted S-shaped pathway or labyrinth for plasma to travel. The shape of the pathway is advantageous, for example, because it hinders and impedes ingress of plasma species into this region, reducing undesirable deposition of sputtered material.

Figure 4:
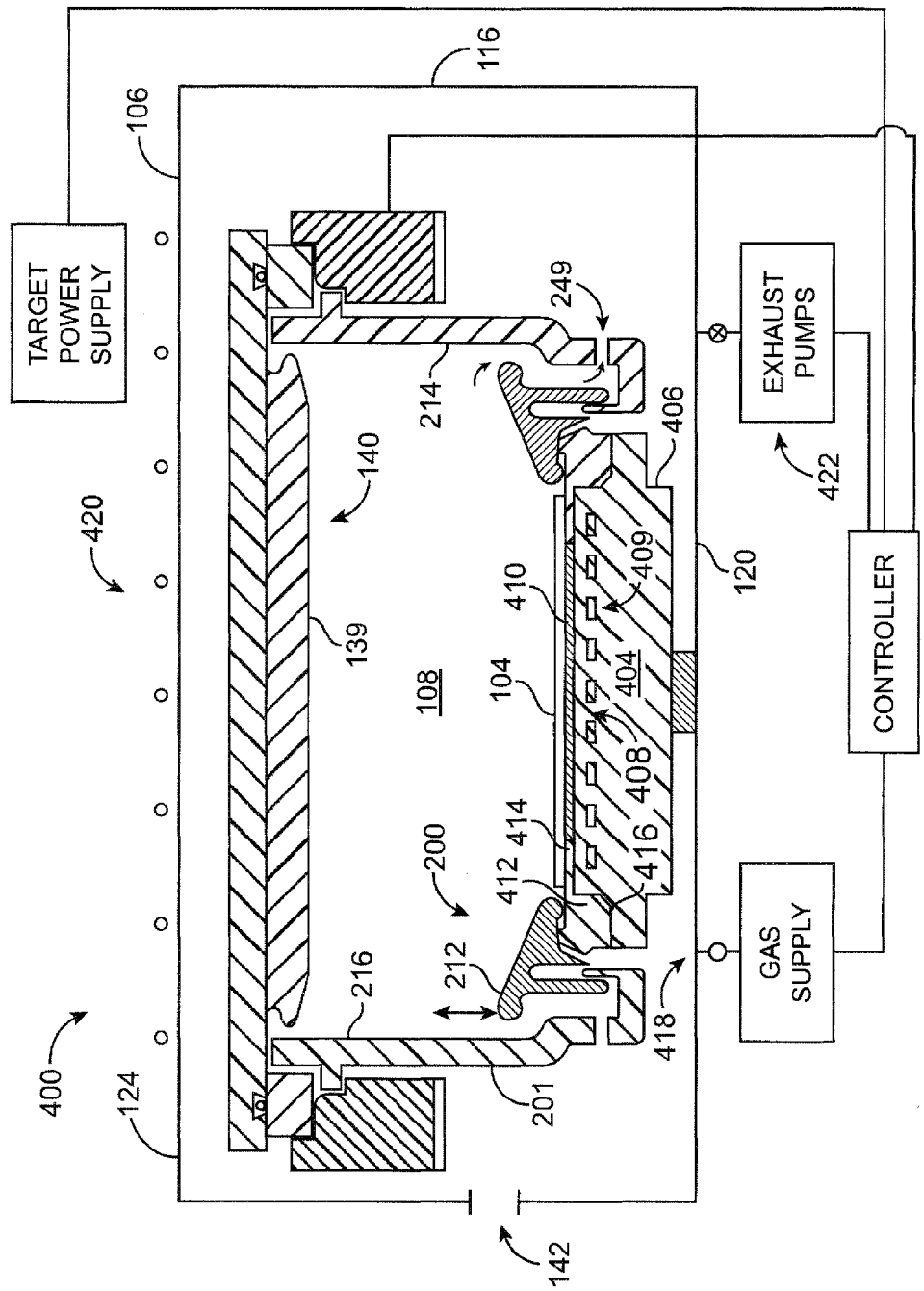
FIG. 4 is a schematic sectional side view of another version of a substrate processing chamber showing a shield and ring assembly.

As shown in FIGS. 4 and 5, the sputtering target 140 comprises a sputtering plate 280 mounted to a backing plate 284. The sputtering plate 280 comprises a material to be sputtered onto the substrate 104. The sputtering plate 280 may have a central cylindrical mesa 286 having the sputtering surface 139 that forms a plane that is parallel to the plane of the substrate 104. An annular inclined rim 288 surrounds the cylindrical mesa 286. The annular rim 288 nay be inclined relative to the plane of the cylindrical mesa 286 by an angle of at least about 8°, for example, from about 10° to about 20°. A peripheral inclined sidewall 290 having a step 292 surrounds the annular rim 288. The peripheral sidewall 290 may be inclined relative to the plane of the cylindrical mesa 286 by an angle of at least about 60°, for example, from about 75° to about 85°. The step 292 may occur between a protrusion 294 and recess 296 and the step 292 joins the surfaces at a cutback angle of from about 30° to about 40°.

The complex shape of the annular inclined rim 288 and sidewall 290 that is adjacent to the top wall 216 of the shield 201 in the chamber 100, forms a convoluted gap 300 comprising a dark space region; an area which is highly depleted of free electrons and which can be modeled as a vacuum. It is important to control the dark-space region to prevent plasma entry, arcing and instabilities. The shape of the gap 300 acts as a labyrinth that impedes the passage of sputtered plasma species through the gap 300, and thus, reduces the accumulation of sputtered deposits on the surfaces of the peripheral target region. In one version, the peripheral boundaries of the dark-space region may be treated with a twin-wire aluminum arc spray coating, such as, for example, CLEANCOAT™ to reduce particle shedding in this area.

The sputtering plate 280 comprises a metal or metal compound. For example, the sputtering plate 280 can be a metal, such as, for example aluminum, copper, tungsten, titanium, cobalt, nickel or tantalum. The sputtering plate 280 can also be a metal compound, such as for example, tantalum nitride, tungsten nitride or titanium nitride.

The backing plate 284 which has a support surface 303 to support the sputtering plate 280 and a peripheral ledge 304 that extends beyond the radius of the sputtering plate 280. The backing plate 284 is made from a metal, such as, for example, stainless steel, aluminum, copper-chromium or copper-zinc. The backing plate 284 can be made from a material having a thermal conductivity that is sufficiently high to dissipate the heat generated in the target 140, which is formed in both the sputtering plate 280 and the backing plate 284. The heat is generated from the eddy currents that arise in these plates 280, 284 and also from the bombardment of energetic ions from the plasma onto the sputtering surface 139 of the target 140. The higher thermal conductivity backing plate 284 allows dissipation of the heat generated in the target 140 to the surrounding structures or even to a heat exchanger which may be mounted behind the backing plate 284 or may be in the backing plate 284, itself. For example, the backing plate 284 can comprise channels (not shown) to circulate a heat transfer fluid therein. It has been determined that a suitably high thermal conductivity of the backing plate 284 is at least about 200 W/mK, for example, from about 220 to about 400 W/mK. Such a thermal conductivity level allows the target 140 to be operated for longer process time periods by dissipating the heat generated in the target 140 more efficiently.

In combination with a backing plate 284 made of a material having a high thermal conductivity and low resistivity, or separately and by itself, the backing plate 284 may comprises a backside surface having one or more grooves (not shown). For example, a backing plate 284 could have a groove, such as annular groove, or a ridge, for cooling the backside 141 of the target 140. The grooves and ridges can also have other patterns, for example, rectangular grid pattern, chicken feet patterns, or simply straight lines running across the backside surface.

The sputtering plate 280 can be mounted on the backing plate 284 by diffusion bonding, by placing the two plates 280,284 on each other and heating the plates 280, 284 to a suitable temperature, typically at least about 200° C. Optionally, the sputtering target 140 may be a monolithic structure comprising a single piece of material having enough depth to serve as both the sputtering plate and backing plate.

The peripheral ledge 304 of the backing plate 284 comprises an outer footing 308 that rests on an isolator 310 in the chamber 100 (FIGS. 2A-B and 3). The peripheral ledge 304 contains an O-ring groove 312 into which an O-ring 314 is placed to form a vacuum seal. The isolator 310 electrically isolates and separates the backing plate 284 from the chamber 100, and is typically a ring from a dielectric or insulative material such as aluminum oxide. The peripheral ledge 304 is shaped to inhibit the flow or migration of sputtered material and plasma species through a gap between the target 140 and the isolator 310, to impede the penetration of low-angle sputtered deposits into the gap.

The peripheral ledge 304 of the target 140 is coated with a protective coating, for example, a twin-wire arc sprayed aluminum coating. Before coating, the peripheral ledge 304 is degreased and ground with a silicon carbide disc to achieve a roughness of 200 to 300 microinches. The coating extends to cover the peripheral sidewall 290 of the sputtering plate 280 and the peripheral ledge 304 of the backing plate 284. The coating has a final surface roughness of from about 500 to about 900 microinches, and a thickness of from about 5 to about 10 mils. The coating protects the edges of the target 140 and provides better adhesion of the sputtered material and reduces flaking of the material from these surfaces.

The sputtering target 140 is connected to a target power supply 320 which applies a bias voltage to the target 140 relative to the shield 201 which is electrically floated during a sputtering process. While the target power supply 320 supplies power to the target 140, shield 201, support 130 and other chamber components connected to the target power supply 320, the gas energizer 324 energizes the sputtering gas to form a plasma of the sputtering gas. The gas energizer 324 may comprise a source coil 326 that is powered by the application of a current through the coil 326. The plasma formed energetically impinges upon and bombards the sputtering surface 139 of the target 140 to sputter material off the surface 139 onto the substrate 104.

The chamber 100 may comprise a magnetic field generator 330 to shape a magnetic field about the target 140 to improve sputtering of the target 140. The capacitively generated plasma may be enhanced by a magnetic field generator 330 in which for example, a permanent magnet or electromagnetic coils may provide a magnetic field in the chamber 100 that has a rotating magnetic field having an axis that rotates parallel to the plane of the substrate 104. The chamber 100 may, in addition or alternatively, comprise a magnetic field generator 330 that generates a magnetic field near the target 140 of the chamber 100 to increase an ion density in a high-density plasma region adjacent to the target 140 to improve the sputtering of the target 140 material. An improved magnetic field generator 330 may be used to allow sustained self-sputtering of copper or sputtering of aluminum, titanium, or other metals; while minimizing the need for non-reactive gases for target bombardment purposes, for example, as described in U.S. Pat. No. 6,183,614, issued to Fu and entitled "Rotating Sputter Magnetron Assembly"; and U.S. Pat. No. 6,274,008, issued to Gopalraja et al. and entitled "Integrated Process for Copper Via Filling," both of which are incorporated herein by reference in their entirety. The magnetic field extends through the substantially non-magnetic target 140 into the chamber 100.

The sputtering gas is introduced into the chamber 100 through a gas delivery system 332, which provides gas from a gas supply 334 via conduits 336 having gas flow control valves 338, such as a mass flow controllers, to pass a set flow rate of the gas therethrough. The gases are fed to a mixing manifold (not shown) in which the gases are mixed to from a desired process gas composition and fed to a gas distributor 340 having gas outlets to introduce the gas into the chamber 100. The process gas may comprise a non-reactive gas, such as argon or xenon, which is capable of energetically impinging upon and sputtering material from the target 140. The process gas may also comprise a reactive gas, such as one or more of an oxygen-containing gas and a nitrogen-containing gas, that are capable of reacting with the sputtered material to form a layer on the substrate 104. The gas is then energized by the gas energizer 324 to form a plasma to sputter the sputtering target 140. Spent process gas and byproducts are exhausted from the chamber 100 through an exhaust 342. The exhaust 342 comprises an exhaust port 344 that receives spent process gas and passes the spent gas to an exhaust conduit 346 having a throttle valve to control the pressure of the gas in the chamber 100. The exhaust conduit 346 is connected to one or more exhaust pumps 348. Typically, the pressure of the sputtering gas in the chamber 100 is set to sub-atmospheric levels, such as a vacuum environment, for example, gas pressures of 1 mTorr to 400 mTorr.

The chamber 100 may be controlled by a controller 350 that comprises program code having instruction sets to operate components of the chamber 100 to process a substrate 104. For example, the controller 350 can comprise program code that includes substrate positioning instruction sets to operate the substrate support 130 and substrate transfer mechanism; gas flow control instruction sets to operate gas flow control valves to set a flow of sputtering gas to the chamber 100; gas pressure control instruction sets to operate the exhaust throttle valve to maintain a pressure in the chamber 100; gas energizer control instruction sets to operate the gas energizer 324 to set a gas energizing power level; temperature control instruction sets to control a temperature control system in the support 130 or wall 106 to set temperatures of various components in the chamber 100; and process monitoring instruction sets to monitor the process in the chamber 100.

Another version of a sputtering chamber 400 is described referring to FIG. 4. This chamber 400 may be, for example, but is not limited to, a VERSA TTN™ chamber, available from Applied Materials Inc., Santa Clara, Calif. The chamber 400 has a sputtering target 140 for depositing sputtered material onto a substrate 104. The sputtering target 140 is positioned opposite of a substrate support 404 that faces the sputtering target 140. The substrate support 404 comprises a pedestal 406 having a receiving surface 408. The pedestal 406 may be constructed from a material such as, for example, stainless steel. A resistive heater 409 is embedded within the pedestal 406 and serves to heat a substrate 104 on the pedestal 406. The sputtering target 140 and substrate support 404 are encircled by a shield 201. A cover ring 212 is placed about the substrate support 404 and is supported by a deposition ring 208. The deposition ring 208 comprises a disk 410 for placement on the receiving surface 408 of the pedestal 406. The diameter of the disk 410 is smaller than the diameter of the receiving surface 408 of the pedestal 406. The deposition ring 208 further comprises an annular wedge 412 which encircles the disk 410. A cylindrical band 414 extends horizontally and inwardly from the annular wedge 412. The annular wedge 412 has a footing 416 which rests on the pedestal 406 of the substrate support 404. The chamber 400 also has a gas distributor 418, a gas energizer 420, and a gas exhaust 422.

The process kit 200 described above significantly increase the number of process cycles and processing time in the chamber 100, increasing the amount of time between cleaning. This is accomplished by reducing the amount of sputtering deposits formed on the components around the substrate 104, which are difficult to clean. The components of the process kit 200 are designed to allow increased power and pressure in the sputtering zone 108 to yield higher deposition throughput by reducing the temperature in the dark-space region of the gap 300. This also improves the thermal uniformity of the shield 201 using the adapter 226. In addition, compared to exiting process kits, process kit 200 is designed to allow at least about 2 to about 5 times more deposits to be deposited thereupon before the kit 200 has to be changed and a maintenance cycle performed. This is a significant improvement in the uptime of the chamber 100 and also increases process throughput.

The present invention has been described with reference to certain preferred versions thereof; however, other versions are possible. For example, the process kit 200 or components thereof and the adapter 226 can be used in other types of applications, as would be apparent to one of ordinary skill, for example, etching, CVD and etching chambers. Therefore, the spirit and scope of the appended claims should not be limited to the description of the preferred versions contained herein.

What is claimed is:

1. A shield for encircling a sputtering target that faces a substrate support in a substrate processing chamber, the shield comprising:
    (a) a cylindrical band having a top wall that surrounds the sputtering target and a bottom wall that surrounds the substrate support;
    (b) a support ledge extending radially outward from the top wall of the cylindrical band;
    (c) a sloped step that extends radially inward from the bottom wall of the cylindrical band; and
    (d) a U-shaped channel joined to the sloped step and which surrounds the substrate support, the U-shaped channel comprising first and second legs, the first leg having a plurality of gas holes to allow process gas to pass therethrough, whereby the gas holes provide elevated gas conductance.

2. A shield according to claim 1 wherein the gas holes in the first leg are substantially oval.

3. A shield according to claim 2 wherein the gas holes have a width of from about 2.54 to about 5.08 cm, and a height of from about 0.51 to about 2.03 cm.

4. A shield according to claim 1 wherein the sloped step comprises a curved joint.

5. A shield according to claim 1 wherein the first leg of the U-shaped channel comprises a height that is larger than the second leg.

6. A shield according to claim 1 comprising a unitary structure composed of aluminum.

7. A shield according to claim 6 comprising a twin-wire aluminum arc spray coating on the surface of the shield.

8. A shield according to claim 7 wherein the twin-wire aluminum arc spray coating comprises a surface roughness of from about 600 to about 2300 microinches.

9. A shield according to claim 1 wherein the support ledge comprises a resting surface and a plurality of slots therethrough.

10. An assembly comprising an adapter and a shield according to claim 9, the adapter comprising a contact surface that contacts the resting surface of the support ledge of the shield, to support the shield and provide good thermal conductance therebetween.

11. An assembly according to claim 10 further comprising an alignment pin system for aligning the shield to the adapter, the alignment pin system comprising a plurality of pins spaced apart in a circular arrangement on the adapter, each pin comprising a rigid member having a press-fit connector that press fits into the adapter and a head that fits into one of the plurality of slots on the support ledge of the shield.

12. An adapter according to claim 10 wherein the resting surface of the shield and the contact surface of the adapter each have a surface roughness of from about 600 to about 2300 microinches.

13. An assembly according to claim 10 comprising conduits for flowing a heat transfer fluid.

14. A cover ring for placement about a deposition ring in a substrate processing chamber, the deposition ring disposed between a substrate support and a cylindrical shield in the chamber, and the cover ring comprising:
    (a) an annular wedge comprising an inclined top surface that encircles the substrate support, the inclined top surface having an inner and outer periphery, a bulb-shaped protuberance about the outer periphery of the inclined top surface, a footing extending downward from the inclined top surface to rest on the deposition ring, and a projecting brim about the inner periphery of the inclined top surface; and
    (b) inner and outer cylindrical bands extending downward from the annular wedge, the inner band having a smaller height than the outer band.

15. A cover ring according to claim 14 wherein the inclined top surface of the annular wedge slopes radially inward.

16. A cover ring according to claim 15 wherein the inclined top surface is inclined at an angle of from at least about 15 degrees.

17. A cover ring according to claim 14 wherein the bulb-shaped protuberance comprises an elliptical circumferential surface that forms a gap with the cylindrical shield.

18. A cover ring according to claim 14 wherein the cover ring is capable of being raised and lowered to adjust the height of the cover ring in relationship to the substrate support in the substrate processing chamber.

19. A cover ring according to claim 14 wherein the cover ring comprises titanium.

20. A cover ring according to claim 19 wherein the titanium comprises a purity of at least about 99.9 percent.

21. A cover ring according to claim 14 wherein the inner and outer cylindrical bands are substantially vertical.

22. A cover ring according to claim 14 comprising an exposed surface having a twin-wire aluminum arc spray coating.

23. A process kit for placement about a sputtering target and substrate support in a substrate processing chamber, the process kit comprising:
    (a) a shield encircling the sputtering target, the shield comprising:
        (1) a cylindrical band surrounding the sputtering target and substrate support;
        (2) a support ledge extending radially outward from the cylindrical band;
        (3) a sloped step below the support ledge and that extends radially inward from the cylindrical band; and
        (4) a U-shaped channel joined to the sloped step and which surrounds the substrate support, the U-shaped channel comprising first and second legs, the first leg having a plurality of gas holes to allow process gas to pass therethrough with elevated gas conductance; and
    (b) a ring assembly comprising:
        (1) a cover ring about the substrate support, the cover ring comprising an annular wedge comprising an inclined top surface about the substrate support, the inclined top surface having an inner and outer periphery, a bulb-shaped protuberance about the outer periphery of the inclined top surface, a footing extending downward from the inclined top surface to rest on the deposition ring, a projecting brim about the inner periphery of the inclined top surface; inner and outer cylindrical bands extending downward from the annular wedge, the inner cylindrical band having a smaller height than the outer cylindrical band; and
        (2) a deposition ring supporting the cover ring.

24. A process kit according to claim 23 wherein the shield, cover ring and deposition ring each comprise an exposed surface with a twin-wire aluminum arc spray coating.

25. A sputtering chamber comprising:

(a) a sputtering target for depositing sputtered material onto a substrate;

(b) a substrate support opposing the sputtering target;

(c) a shield encircling the sputtering target and the substrate support, the shield comprising a U-shaped channel which surrounds the substrate support and having a plurality of gas holes to allow process gas to pass therethrough;

(d) a cover ring disposed about the periphery of the substrate support;

(e) a deposition ring supporting the cover ring; the deposition ring comprising a disk for placement on the receiving surface of the substrate support and an annular wedge encircling the disk, the annular wedge comprising a cylindrical band extending inwardly from the annular wedge, and a footing which rests on the substrate support;

(f) a gas distributor to introduce a gas into the chamber;

(g) a gas energizer to energize the gas to form a plasma to sputter material from the sputtering target; and (h) a gas exhaust to exhaust gas from the chamber.

* * * * *

UNITED STATES PATENT AND TRADEMARK OFFICE
CERTIFICATE OF CORRECTION

| | | |
|---|---|---|
| PATENT NO. | : 7,981,262 B2 | Page 1 of 1 |
| APPLICATION NO. | : 11/668461 | |
| DATED | : July 19, 2011 | |
| INVENTOR(S) | : Pavloff et al. | |

It is certified that error appears in the above-identified patent and that said Letters Patent is hereby corrected as shown below:

Column 4, Line 56, please insert -- The shield 201 allows for gas from the process chamber 100 to pass through the gas holes 249 with reduced resistance and circulate through the U-shaped channel 246. The design of the shield 201 further minimizes the sensitivity of gas conductance to the substrate support 130 position in terms of height. -- after inches.;

Column 7, Line 30, please delete "or";

Column 7, Line 51, please delete "nay" and insert -- may -- therefor.

Signed and Sealed this
Fourteenth Day of August, 2012

David J. Kappos
*Director of the United States Patent and Trademark Office*